US012774533B2

(12) United States Patent
Wang et al.

(10) Patent No.: US 12,774,533 B2
(45) Date of Patent: Oct. 27, 2026

(54) METHODS AND DEVICES FOR PREPARING SINGLE-CRYSTAL CLADDINGS

(71) Applicant: BOYA ADVANCED MATERIALS CO., LTD., Meishan (CN)

(72) Inventors: Yu Wang, Meishan (CN); Peng Gu, Meishan (CN); Zhenxing Liang, Meishan (CN)

(73) Assignee: BOYA ADVANCED MATERIALS CO., LTD., Meishan (CN)

( * ) Notice: Subject to any disclaimer, the term of this patent is extended or adjusted under 35 U.S.C. 154(b) by 177 days.

(21) Appl. No.: 18/416,849

(22) Filed: Jan. 18, 2024

(65) Prior Publication Data

US 2024/0158947 A1 May 16, 2024

Related U.S. Application Data

(63) Continuation of application No. PCT/CN2022/106432, filed on Jul. 19, 2022.

(30) Foreign Application Priority Data

Jul. 19, 2021 (CN) ......................... 202110814718.4

(51) Int. Cl.
*C30B 25/16* (2006.01)
*C03C 25/104* (2018.01)
(Continued)

(52) U.S. Cl.
CPC ............ *C30B 1/023* (2013.01); *C03C 25/104* (2013.01); *C03C 25/16* (2013.01); *C30B 29/28* (2013.01)

(58) Field of Classification Search
CPC ....... C30B 29/28; C30B 1/023; C03C 25/104; C03C 25/16
See application file for complete search history.

(56) References Cited

U.S. PATENT DOCUMENTS 4,521,073 A * 6/1985 Murakami ............ C03C 13/008 385/144
7,116,887 B2 * 10/2006 Farroni ............. C03B 37/01217 385/142
(Continued)

FOREIGN PATENT DOCUMENTS

CN 1186483 C 1/2005
CN 1785870 A 6/2006
(Continued)

OTHER PUBLICATIONS

International Search Report in PCT/CN2022/106432 mailed on Sep. 28, 2022, 8 pages.
(Continued)

*Primary Examiner* — Robert M Kunemund
(74) *Attorney, Agent, or Firm* — METIS IP LLC

(57) ABSTRACT

Disclosed are a method and a device for preparing a single-crystal cladding. The method may include preparing an amorphous material; melting the amorphous material to form an amorphous melt; submerging an optical fiber in the amorphous melt; forming an amorphous cladding around a periphery of the optical fiber; and obtaining the single-crystal cladding by performing a crystallization process on the amorphous cladding. The device may include an amorphous material preparation component configured to prepare an amorphous material; an amorphous cladding preparation component configured to melt the amorphous material to form an amorphous melt, submerge an optical fiber in the amorphous melt, and form an amorphous cladding around a periphery of the optical fiber based on the amorphous melt and the optical fiber; and a single-crystal cladding preparation assembly configured to perform a crystallization process on the amorphous cladding to obtain a single-crystal cladding.

16 Claims, 6 Drawing Sheets

(51) Int. Cl.

| | |
|---|---|
| ***C03C 25/16*** | (2006.01) |
| ***C30B 1/02*** | (2006.01) |
| ***C30B 29/28*** | (2006.01) |

(56) References Cited

U.S. PATENT DOCUMENTS

| | | | | |
|---|---|---|---|---|
| 9,069,117 | B1 * | 6/2015 | Ballato | G02B 6/02033 |
| 2004/0086245 | A1 * | 5/2004 | Farroni | G02B 6/024 385/142 |
| 2007/0089462 | A1 | 4/2007 | Farroni et al. | |
| 2013/0092897 | A1 | 4/2013 | Shambat et al. | |
| 2014/0217630 | A1 | 8/2014 | Redjdal et al. | |
| 2017/0031091 | A1 | 2/2017 | Yin et al. | |
| 2018/0045883 | A1 | 2/2018 | Yin et al. | |
| 2022/0002897 | A1 | 1/2022 | Wang et al. | |

FOREIGN PATENT DOCUMENTS

| | | | |
|---|---|---|---|
| CN | 1929101 | A | 3/2007 |
| CN | 101307484 | A | 11/2008 |
| CN | 107915481 | A | 4/2018 |
| CN | 207570308 | U | 7/2018 |
| CN | 109680241 | A | 4/2019 |
| CN | 209364168 | U | 9/2019 |
| CN | 111170629 | A | 5/2020 |
| CN | 111290071 | A | 6/2020 |
| CN | 111365991 | A | 7/2020 |
| CN | 112397379 | A | 2/2021 |
| CN | 112521016 | A | 3/2021 |
| CN | 113480198 | A | 10/2021 |
| EP | 0234233 | A2 | 9/1987 |
| EP | 1311878 | B1 | 9/2006 |
| EP | 2261181 | A1 | 12/2010 |
| JP | S5735802 | A | 2/1982 |
| JP | S58168003 | A | 10/1983 |
| JP | S6128904 | A | 2/1986 |
| JP | H0415627 | A | 1/1992 |
| WO | 2017219118 | A1 | 12/2017 |

OTHER PUBLICATIONS

Written Opinion in PCT/CN2022/106432 mailed on Sep. 28, 2022, 8 pages.

First Office Action in Chinese Application No. 202110814718.4 mailed on Mar. 7, 2022, 13 pages.

Mark Dubinskii et al., Low-loss 'crystalline-core/crystalline-clad' (C4) fibers for highly power scalable high efficiency fiber lasers, Optics Express, 26(4), 2018, 10 pages.

Feng, Duan et al., Preparation of amorphous materials from melts, Introduction to Materials Science—An Integrated Approach, Chemical Industry Press, 2002, 7 pages.

Ma, Xiaoguang et al., Pressureless glass crystallization of transparent yttrium aluminum garnet-based nanoceramics, Natur Communications, 9: 1-9, 2018.

Shen, Binglei et al., Research Progress of Rare Earth Doped Yttrium Aluminum Garnet Crystal Laser Fiber, Materials Reports, 35(9): 09123-09132, 2021.

The Extended European Search Report in European Application No. 22845303.1 mailed on Sep. 26, 2024, 8 pages.

* cited by examiner

211

212

METHODS AND DEVICES FOR PREPARING SINGLE-CRYSTAL CLADDINGS

CROSS-REFERENCE TO RELATED APPLICATION

This application is a Continuation of International Application No. PCT/CN2022/106432, filed on Jul. 19, 2022, which claims priority to Chinese Application No. 202110814718.4, filed on Jul. 19, 2021, the entire contents of each of which are incorporated herein by reference.

TECHNICAL FIELD

The present disclosure relates to the technical field of a single-crystal optical fiber, and in particular, to a method and a device for preparing a single-crystal cladding.

BACKGROUND

A laser with a fiber structure is widely used in the fields of optoelectronics, optical communication, and superconducting technology due to its excellent performance. A single-crystal fiber, combining the advantages of a crystal and an optical fiber, exhibits even better performances such as a higher mechanical strength, a higher thermal conductivity, a higher pumping efficiency, a higher beam quality, a lower transmission loss, etc. A single-crystal cladding on an outer surface of a single-crystal fiber core can enclose an optical signal to propagate within the core, which further improves a laser performance of the single-crystal optical fiber. Existing techniques for preparing the single-crystal cladding are a high device requirement and involve considerable operational complexity. Therefore, it is desirable to provide a method and a device for preparing a single-crystal cladding, which can easily and quickly prepare the single-crystal cladding.

SUMMARY

One of the embodiments of the present disclosure provides a method for preparing a single-crystal cladding. The method may include preparing an amorphous material; melting the amorphous material to form an amorphous melt; submerging an optical fiber in the amorphous melt; forming an amorphous cladding around a periphery of the optical fiber based on the amorphous melt and the optical fiber; and obtaining the single-crystal cladding by performing a crystallization process on the amorphous cladding.

One of the embodiments of the present disclosure provides a device for preparing the single-crystal cladding. The device may include an amorphous material preparation component, an amorphous cladding preparation component, and a single-crystal cladding preparation assembly. The amorphous material preparation component may be configured to prepare the amorphous material. The amorphous cladding preparation component may be configured to melt the amorphous material to form the amorphous melt, submerge the optical fiber in the amorphous melt, and form the amorphous cladding around the periphery of the optical fiber. The single-crystal cladding preparation assembly may be configured to perform the crystallization process on the amorphous cladding to obtain the single-crystal cladding.

BRIEF DESCRIPTION OF THE DRAWINGS

The present disclosure will be further illustrated by way of exemplary embodiments, which will be described in detail using the accompanying drawings. These embodiments are not limiting, and in these embodiments, the same numbering denotes the same structure, wherein.

Figure 1:
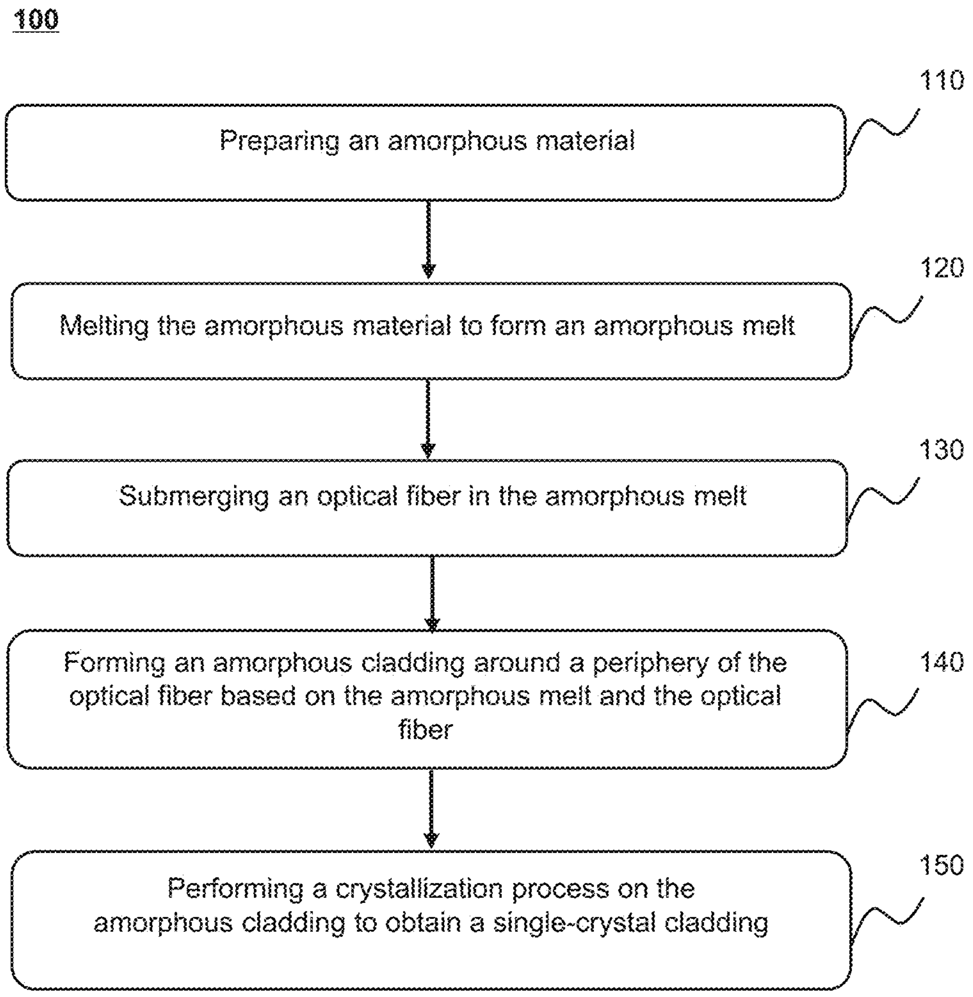
FIG. 1 is a flowchart illustrating an exemplary process for preparing a single-crystal cladding according to some embodiments of the present disclosure.

In the drawings: 200 denotes a device for preparing a single-crystal cladding, 210 denotes an amorphous material preparation component, 211 denotes a melt assembly, 211-1 denotes a main cavity, 211-11 denotes a cavity upper cover, 211-111 denotes a boss, 211-12 denotes a cavity lower cover, 211-121 denotes a cavity lower plate, 211-1211 denotes an opening, 211-122 denotes a cavity lower cover support, 211-123 denotes a cavity lower cover body, 211-1231 denotes a pull tab, 211-13 denotes a middle cavity, 211-2 denotes a melt cavity, 211-3 denotes a heating element, 211-4 denotes a moving element, 211-41 denotes a connecting rod, 212 denotes a dispersing and cooling assembly, 212-1 denotes an ejecting element, 212-11 denotes an ejection port, 212-2 denotes a collecting element, 212-21 denotes a collecting body, 212-211 denotes a collection port, 212-212 denotes a hole, 212-22 denotes a collecting frame, 212-23 denotes a baffle plate, 212-3 denotes an oscillating element, 220 denotes an amorphous cladding preparation component, 221 denotes a clamping assembly, 221-1 denotes a clamping element, 221-2 denotes an adjusting element, 221-3 denotes a fixing element, 230 denotes a single-crystal cladding preparation component, 231 denotes an arc discharge assembly, 231-1 denotes a power element, 231-11 denotes an up-and-down movement driving member, 231-111 denotes a support, 231-112 denotes a screw, 231-113 denotes a slider, 231-114 denotes a first driving motor, 231-12 denotes a rotational movement driving member, 231-121 denotes a support bracket, 231-122 denotes a connecting member, 231-123 denotes a stabilizing member, 231-124 denotes a second driving motor, 231-2 denotes an arc discharge element, 240 denotes a monitoring component, 250 denotes a controlling component, 260 denotes a displaying component, and 270 denotes a storing component.

DETAILED DESCRIPTION

In order to more clearly illustrate the technical solutions of the embodiments of the present disclosure, the accompanying drawings required to be used in the description of the embodiments will be briefly described below. Obviously, the accompanying drawings in the following description are only some examples or embodiments of the present disclosure, and it is possible for a person of ordinary skill in the art to apply the present disclosure to other similar scenarios in accordance with these drawings without creative labor. Unless obviously obtained from the context or the context illustrates otherwise, the same numeral in the drawings refers to the same structure or operation.

It should be understood that the terms "system," "device," "unit," and/or "module" as used herein are a way to distinguish between different components, elements, parts, sections, or assemblies at different levels. However, the words may be replaced by other expressions if other words accomplish the same purpose.

As shown in the present disclosure and the claims, unless the context suggests an exception, the words "one," "an," "a," "one kind," and/or "the" do not refer specifically to the singular, but may also include the plural. Generally, the terms "including" and "comprising" suggest only the inclusion of clearly identified steps and elements that do not constitute an exclusive list, and the method or device may also include other steps or elements.

Flowcharts are used in the present disclosure to illustrate operations performed by a system by embodiments of the present disclosure. It should be appreciated that the preceding or following operations are not necessarily performed in an exact sequence. Instead, the operations may be processed in a reverse order or simultaneously. Also, it is possible to add other operations to these processes, or to omit one or operation from these processes.

FIG. 1 is a flowchart illustrating an exemplary process for preparing a single-crystal cladding according to some embodiments of the present disclosure. In some embodiments, process 100 may be performed by one or more components in a single-crystal cladding preparation device (e.g., a device 200 for preparing a single-crystal cladding). In some embodiments, process 100 may be automatically executed by a control system. For example, process 100 may be realized via a control instruction, and the control system controls various components to complete various operations of process 100 based on the control instruction. In some embodiments, process 100 may be executed semi-automatically. For example, one or more operations of process 100 may be manually performed by an operator. In some embodiments, one or more additional operations not described may be added to process 100, and/or one or more operations discussed herein may be deleted from process 100. Additionally, the order of operations shown in FIG. 1 is not limiting. As shown in FIG. 1, process 100 may include the following operations 110-150.

In 110, an amorphous material may be prepared. In some embodiments, operation 110 may be performed by an amorphous material preparation component 210.

In some embodiments, the amorphous material preparation component may melt a raw material used to prepare the amorphous material to form a raw material melt, and perform a cooling process on the raw material melt to prepare the amorphous material. In some embodiments, a melting process of the raw material may be accomplished by a melt assembly (e.g., a melt assembly 211). In some embodiments, the cooling process may be implemented by a cooling assembly (e.g., a dispersing and cooling assembly 212). The following description takes the amorphous material being an amorphous YAG (Yttrium Aluminum Garnet, $Y_3Al_5O_{12}$) as an example.

In some embodiments, the raw material may be in the form of a powder, a block, a pellet, or the like.

In some embodiments, a purity of the raw material may be within a predetermined range to balance costs and a performance of a subsequently grown single-crystal cladding. In some embodiments, the purity of the raw material may be greater than or equal to 99.0%. In some embodiments, the purity of the raw material may be greater than or equal to 99.9%. In some embodiments, the purity of the raw material may be greater than or equal to 99.99%. In some embodiments, the purity of the raw material may be greater than or equal to 99.999%.

In some embodiments, components of the raw material and the amorphous material may be the same or different.

In some embodiments, the raw material may include yttrium-containing oxides and aluminum-containing oxides. In some embodiments, the yttrium-containing oxides may include but are not limited to $Y_2O_3$, or the like. In some embodiments, the aluminum-containing oxides may include but are not limited to $Al_2O_3$, or the like. In some embodiments, during a melting process of the yttrium-containing oxides and the aluminum-containing oxides, the yttrium-containing oxides and the aluminum-containing oxides may undergo a chemical reaction (e.g., a solid-phase reaction) to generate a YAG melt. Correspondingly, the raw material melt is the YAG melt.

In some embodiments, the raw material may include a crystalline-phase YAG solid (e.g., a YAG polycrystalline powder). In some embodiments, the crystalline-phase YAG solid may be melted to form the YAG melt. Correspondingly, the raw material melt is the YAG melt. In contrast to a way of generating the YAG melt based on a reaction of an oxide material, a way of obtaining the YAG melt based on the crystalline-phase YAG solid avoids components of the oxide material (e.g., the yttrium-containing oxides and the aluminum-containing oxides) from volatilization or segregation during melting at a high temperature, which ensures accuracy of a subsequent process.

In some embodiments, the crystalline-phase YAG solid may be prepared using a solid-phase reaction technique. In some embodiments, materials (e.g., the yttrium-containing oxides and the aluminum-containing oxides) for preparing the crystalline-phase YAG solid may be mixed in a predetermined ratio and then calcined under a predetermined condition to produce the crystalline-phase YAG solid. In some embodiments, the predetermined condition may include a predetermined calcination temperature and a predetermined calcination time.

In some embodiments, the predetermined calcination temperature may be controlled to be within a predetermined range to improve a purity and quality of the crystalline-phase YAG solid. In some embodiments, the predetermined calcination temperature may be in a range of 1400° C. to 1700° C. In some embodiments, the predetermined calcination temperature may be in a range of 1420° C. to 1680° C. In some embodiments, the predetermined calcination temperature may be in a range of 1440° C. to 1660° C. In some embodiments, the predetermined calcination temperature may be in a range of 1460° C. to 1640° C. In some embodiments, the predetermined calcination temperature may be in a range of 1480° C. to 1620° C. In some embodiments, the predetermined calcination temperature may be in a range of 1500° C. to 1600° C. In some embodiments, the predetermined calcination temperature may be in a range of 1520° C. to 1580° C. In some embodiments, the predetermined calcination temperature may be in a range of 1540° C. to 1560° C.

In some embodiments, the predetermined calcination time may be controlled within a predetermined range to improve calcination efficiency and to ensure the quality of the crystalline-phase YAG solid. In some embodiments, the predetermined calcination time may be in a range of 5 h to 25 h. In some embodiments, the predetermined calcination time may be in a range of 6 h to 24 h. In some embodiments, the predetermined calcination time may be in a range of 7 h to 23 h. In some embodiments, the predetermined calcination time may be in a range of 8 h to 22 h. In some embodiments, the predetermined calcination time may be in a range of 9 h to 21 h. In some embodiments, the predetermined calcination time may be in a range of 10 h to 20 h. In some embodiments, the predetermined calcination time may be in a range of 10.5 h to 19.5 h. In some embodiments, the predetermined calcination time may be in a range of 11 h to 19 h. In some embodiments, the predetermined calcination time may be in a range of 11.5 h to 18.5 h. In some embodiments, the predetermined calcination time may be in a range of 12 h to 18 h. In some embodiments, the predetermined calcination time may be in a range of 12.5 h to 17.5 h. In some embodiments, the predetermined calcination time may be in a range of 13 h to 17 h. In some embodiments, the predetermined calcination time may be in a range of 13.5 h to 16.5 h. In some embodiments, the predetermined calcination time may be in a range of 14 h to 16 h. In some embodiments, the predetermined calcination time may be in a range of 14.5 h to 15.5 h.

In some embodiments, the crystalline-phase YAG solid may be prepared using a chemical co-precipitation technique. In some embodiments, a solution of metal salts comprising yttrium and aluminum may be mixed with a precipitating agent (e.g., an alkaline solution) to obtain a solution comprising a precursor. Further, filtration, drying, and calcination operations may be performed on the solution comprising the precursor to obtain the crystalline-phase YAG solid. In some embodiments, oxides corresponding to yttrium and aluminum (e.g., yttrium oxide and aluminum oxide) may be dissolved in an acid solution (e.g., hydrochloric acid, sulfuric acid, nitric acid) to obtain a corresponding solution of metal salts. Correspondingly, the solution of metal salts comprising yttrium and aluminum may include aluminum nitrate and yttrium nitrate, aluminum chloride, yttrium chloride, or the like. In some embodiments, the precipitating agent may include at least one of ammonia or ammonium bicarbonate.

In some embodiments, the crystalline-phase YAG solid may also be obtained using other techniques such as a sol-gel technique, a solvent (e.g., water) thermal technique, or the like.

In some embodiments, melting-related parameter(s) may be determined based on properties of the raw material. In some embodiments, the melting-related parameter(s) may be determined by a controlling component 250. Setting corresponding melting-related parameter(s) for different raw materials may realize automatic control of the melting process of the raw materials.

In some embodiments, the properties of the raw material may include, but are not limited to, a state of the raw material (e.g., a powder, a block, a pellet), components, a purity, or the like.

In some embodiments, the melting-related parameter(s) may include but are not limited to, a heating rate, a melting temperature, an insulting time, or the like.

In some embodiments, the heating rate may be controlled within a predetermined range to improve the melting efficiency of the raw material and to ensure the quality of the raw material melt. In some embodiments, the heating rate may be in a range of 1° C./min to 12° C./min. In some embodiments, the heating rate may be in a range of 1.5° C./min to 11.5° C./min. In some embodiments, the heating rate may be in a range of 2° C./min to 11° C./min. In some embodiments, the heating rate may be in a range of 2.5° C./min to 10.5° C./min. In some embodiments, the heating rate may be in a range of 3° C./min to 10° C./min. In some embodiments, the heating rate may be in a range of 3.5° C./min to 9.5° C./min. In some embodiments, the heating rate may be in a range of 4° C./min to 9° C./min. In some embodiments, the heating rate may be in a range of 4.5° C./min to 8.5° C./min. In some embodiments, the heating rate may be in a range of 5° C./min to 8° C./min. In some embodiments, the heating rate may be in a range of 5.5° C./min to 7.5° C./min. In some embodiments, the heating rate may be in a range of 6° C./min to 7° C./min.

In some embodiments, the melting temperature may be controlled within a predetermined range to make the raw material react or melt sufficiently (e.g., the yttrium-containing oxides and the aluminum-containing oxides reacting chemically to prepare the YAG melt, or the crystalline-phase YAG solid melting to form the YAG melt), thereby ensuring the quality of the raw material melt. In some embodiments, the melting temperature may be in a range of 1900° C.-2100° C. In some embodiments, the melting temperature may be in a range of 1910° C. to 2090° C. In some embodiments, the melting temperature may be in a range of 1920° C. to 2080° C. In some embodiments, the melting temperature may be in a range of 1930° C. to 2070° C. In some embodiments, the melting temperature may be in a range of 1940° C. to 2060° C. In some embodiments, the melting temperature may be in a range of 1950° C. to 2050° C. In some embodiments, the melting temperature may be in a range of 1960° C. to 2040° C. In some embodiments, the melting temperature may be in a range of 1970° C. to 2030° C. In some embodiments, the melting temperature may be in a range of 1980° C. to 2020° C. In some embodiments, the melting temperature may be in a range of 1990° C. to 2010° C.

In some embodiments, the insulting time needs to be controlled within a predetermined range to allow the raw material to react or melt sufficiently to ensure the quality of the raw material melt. In some embodiments, the insulting time may be in a range of 2 h to 12 h. In some embodiments, the insulting time may be in a range of 3 h to 11 h. In some embodiments, the insulting time may be in a range of 3.5 h to 10.5 h. In some embodiments, the insulting time may be in a range of 4 h to 10 h. In some embodiments, the insulting time may be in a range of 4.5 h to 9.5 h. In some embodiments, the insulting time may be in a range of 5 h to 9 h. In some embodiments, the insulting time may be in a range of 5.5 h to 8.5 h. In some embodiments, the insulting time may be in a range of 6 h to 8 h. In some embodiments, the insulting time may be in a range of 6.5 h to 7.5 h.

In some embodiments, as described above, after obtaining the raw material melt, a cooling process may be performed on the raw material melt to prepare the amorphous material. In some embodiments, the cooling process may be performed on the raw material melt to form the amorphous material by ejecting a fluid. By ejecting the fluid, the raw material melt may be dispersed into fine melt droplets, and accordingly, a contact area between the raw material melt and the fluid or air may be increased, so that the raw material melt can be cooled down rapidly, thereby improving a preparing efficiency and quality of the amorphous material.

In some embodiments, the controlling component may determine parameter(s) of the cooling process based on properties of the raw material melt. In some embodiments, the parameter(s) of the cooling process may be determined by the controlling component 250. Setting corresponding parameter(s) of the cooling process for different raw material melts can make the preparation process of the amorphous material adaptive and ensure that amorphous materials of higher quality can be prepared in different scenarios.

In some embodiments, the properties of the raw material melt may include but are not limited to, a type, a temperature, a viscosity, etc., of the raw material melt.

In some embodiments, the parameter(s) of the cooling process may include but are not limited to, a cooling rate, a temperature range for cooling, a pressure during the cooling process, or the like. In some embodiments, the parameter(s) of the cooling process may include but are not limited to, properties of the fluid, an ejection angle, an ejection pressure, a distance between an ejection port and the raw material melt, or the like.

In some embodiments, the properties of the fluid may include a type, a state, a thermal conductivity, etc., of the fluid. In some embodiments, the type of the fluid may include but is not limited to, $N_2$, $CO_2$, air, inert gas, or the like. In some embodiments, the state of the fluid may include a gaseous state or a liquid state. For example, $N_2$ refers to nitrogen gas or liquid nitrogen. In the process of ejecting the liquid nitrogen or dispersing the raw material melt, the liquid nitrogen may vaporize and absorb heat of the raw material melt, so that the raw material melt can be cooled down more rapidly, which improves the efficiency of an amorphous processing and ensures the quality of the amorphous material.

In some embodiments, the ejection angle refers to an angle between an ejection direction of the fluid and a horizontal plane. In some embodiments, the ejection angle may be controlled within a predetermined range to rapidly cool the raw material melt to obtain a high-quality amorphous material. In some embodiments, the ejection angle may be in a range of 20° to 70°. In some embodiments, the ejection angle may be in a range of 25° to 65°. In some embodiments, the ejection angle may be in a range of 30° to 60°. In some embodiments, the ejection angle may be in a range of 35° to 55°. In some embodiments, the ejection angle may be in a range of 40° to 50°.

In some embodiments, the ejection pressure refers to a force applied to the fluid. In some embodiments, to ensure thorough dispersion of the raw material melt for rapid cooling and to obtain the high-quality amorphous material, the ejection pressure may be controlled within a predetermined range. In some embodiments, the ejection pressure may be in a range of 0.1 MPa to 2.5 MPa. In some embodiments, the ejection pressure may be in a range of 0.2 MPa to 2.2 MPa. In some embodiments, the ejection pressure may be in a range of 0.4 MPa to 2 MPa. In some embodiments, the ejection pressure may be in a range of 0.6 MPa to 1.8 MPa. In some embodiments, the ejection pressure may be in a range of 0.8 MPa to 1.6 MPa. In some embodiments, the ejection pressure may be in a range of 1 MPa to 1.4 MPa. In some embodiments, the ejection pressure may be in a range of 1.1 MPa to 1.3 MPa.

In some embodiments, to ensure thorough dispersion of the raw material melt for rapid cooling and to obtain the high-quality amorphous material, the distance between the ejection port and the raw material melt may be controlled to be within a predetermined range. In some embodiments, the distance between the ejection port and the raw material melt may be in a range of 3 cm to 12 cm. In some embodiments, the distance between the ejection port and the raw material melt may be in a range of 4 cm to 11 cm. In some embodiments, the distance between the ejection port and the raw material melt may be in a range of 5 cm to 10 cm. In some embodiments, the distance between the ejection port and the raw material melt may be in a range of 6 cm to 9 cm. In some embodiments, the distance between the ejection port and the raw material melt may be in a range of 7 cm to 8 cm.

In some embodiments, parameter(s) for preparing the amorphous material (e.g., including the melting-related parameter(s) and/or the parameter(s) of the cooling process) may be determined by a machine learning model. In some embodiments, the controlling component 250 and/or other processing devices may train the machine learning model based on properties of a historical raw material, properties of a historical raw material melt, parameter(s) for preparing a historical amorphous material (e.g., historical melting-related parameter(s) and historical parameter(s) of the cooling process), or the like. For example, an input of the machine learning model may include the properties of the raw material, and an output of the machine learning model may include the melting-related parameter(s). As another example, the input of the machine learning model may include the properties of the raw material melt, and the output of the machine learning model may include the parameter(s) of the cooling process. As yet another example, the input of the machine learning model may include the properties of the material, and the output of the machine learning model may include the parameter(s) for preparing the amorphous material.

In some embodiments, the input of the machine learning model may also include an environmental condition (e.g., humidity and temperature).

In some embodiments, the parameter(s) of the machine learning model may be dynamically updated based on updated experimental data, thereby enhancing the comprehensive learning capability of the machine learning model to determine more accurate parameter(s) for preparing the amorphous material.

In some embodiments, the controlling component 250 may determine the parameter(s) for preparing the amorphous material (e.g., the melting-related parameter(s) and the parameter(s) of the cooling process) based on the properties of the raw material and/or the properties of the raw material melt, and a trained machine learning model. In some embodiments, the controlling component 250 may also adaptively adjust the parameter(s) for preparing the amorphous material output by the machine learning model based on actual situation(s) (e.g., the environmental condition) to adapt to different actual situations.

In some embodiments, the parameter(s) for preparing the amorphous material may also be determined in other manners. For example, the parameter(s) may be determined based on statistical data, empirical parameter(s), user customization, or the like.

In some embodiments, as described above, the dispersed fine melt droplets subjected to the rapid cooling process may form the amorphous material (fine amorphous melts and/or amorphous solid particles). In some embodiments, after preparing the amorphous material, the amorphous material may be collected. In some embodiments, during a collection process, an oscillating element may oscillate the amorphous material to avoid the fine amorphous melts and/or the amorphous solid particles from adhering to an inner wall of the cooling assembly (e.g., the dispersing and cooling assembly 212), thereby improving a utilization rate of the material. More description regarding the oscillation process may be found in FIG. 4 and the descriptions thereof.

In 120, the amorphous material may be melted to form the amorphous melt. In some embodiments, operation 120 may be performed by an amorphous cladding preparation component 220.

In some embodiments, a melting temperature interval for melting the amorphous material (e.g., an amorphous YAG solid particle) to form the amorphous melt may be lower than a melting temperature of a crystalline-phase material (e.g., a YAG single-crystal fiber).

The following description takes the amorphous material being an amorphous YAG (Yttrium Aluminum Garnet, $Y_3Al_5O_{12}$) as an example.

In some embodiments, to prevent crystallization of the amorphous material during the melting process, and at the same time to ensure that the amorphous material melts to form the amorphous melt, a melting temperature interval of the amorphous material may be controlled to be in a predetermined range. In some embodiments, the melting temperature interval of the amorphous material may be in a range of 1500° C. to 1800° C. In some embodiments, the melting temperature interval of the amorphous material may be in a range of 1520° C. to 1780° C. In some embodiments, the melting temperature interval of the amorphous material may be in a range of 1540° C. to 1760° C. In some embodiments, the melting temperature interval of the amorphous material may be in a range of 1560° C. to 1740° C. In some embodiments, the melting temperature interval of the amorphous material may be in a range of 1580° C. to 1720° C. In some embodiments, the melting temperature interval of the amorphous material may be in a range of 1600° C. to 1700° C. In some embodiments, the melting temperature interval of the amorphous material may be in a range of 1620° C. to 1680° C. In some embodiments, the melting temperature interval of the amorphous material may be in a range of 1640° C. to 1660° C.

In some embodiments, to sufficiently melt the amorphous material to form the amorphous melt, it may be necessary to maintain the melting temperature of the amorphous material for a predetermined insulting time, and the predetermined insulting time may be controlled to be in a predetermined range. In some embodiments, the predetermined insulting time may be in a range of 2 h to 15 h. In some embodiments, the predetermined insulting time may be in a range of 3 h to 13 h. In some embodiments, the predetermined insulting time may be in a range of 4 h to 11 h. In some embodiments, the predetermined insulting time may be in a range of 5 h to 10 h. In some embodiments, the predetermined insulting time may be in a range of 6 h to 9 h. In some embodiments, the predetermined insulting time may be in a range of 7 h to 8 h.

In 130, an optical fiber may be submerged in the amorphous melt. In some embodiments, operation 130 may be performed by the amorphous cladding preparation component 220.

In some embodiments, the optical fiber may be pre-prepared. In some embodiments, a crystal rod may be prepared first, and then the optical fiber may be obtained by dissolving and refining the crystal rod in an acid solution, grinding the crystal rod, polishing the crystal rod, or the like.

In some embodiments, the optical fiber may be a doped or non-doped optical fiber. Taking a YAG single-crystal fiber as an example, the optical fiber may be a doped or non-doped YAG single-crystal fiber. In some embodiments, a dopant element (e.g., a rare earth element) in the doped YAG may occupy $Y^{3+}$ in the YAG in a substitutional doping manner. In some embodiments, a molecular formula of the doped YAG may be expressed as $X_{3x}Y_{3(x-1)}Al_5O_{12}$, wherein X denotes the dopant element (e.g., at least one of Nd, Pr, Cr, Tb, Ho, Tm, or Yb), and x denotes a doping concentration of the dopant element. In some embodiments, the doping concentration of the dopant element may be determined based on practical need(s).

In some embodiments, the amorphous cladding preparation component (e.g., a clamping assembly) may submerge the optical fiber horizontally in the amorphous melt. By submerging the optical fiber horizontally, the amorphous melt around a periphery of the optical fiber may be avoided from slipping under gravity (which may result in a non-uniform thickness of a subsequently prepared amorphous cladding). In the present disclosure, "submerging horizontally" refers to that an angle between the optical fiber and the horizontal plane is less than a predetermined threshold. In some embodiments, the predetermined threshold may be in a range of 0° to 15°. In some embodiments, the predetermined threshold may be in a range of 2° to 13°. In some embodiments, the predetermined threshold may be in a range of 4° to 11°. In some embodiments, the predetermined threshold may be in a range of 6° to 9°. In some embodiments, the predetermined threshold may be in a range of 7° to 8°. In some embodiments, the predetermined threshold may be in a range of 0° to 5°. In some embodiments, the predetermined threshold may be in a range of 1° to 4°. In some embodiments, the predetermined threshold may be in a range of 2° to 3°.

In some embodiments, the optical fiber may also be submerged in the amorphous melt in other manners, e.g., vertically submerging, tiltedly submerging, etc., if there is no need to consider a thickness of the cladding or a thickness requirement is not high.

In 140, an amorphous cladding may be formed around the periphery of the optical fiber based on the amorphous melt and the optical fiber. In some embodiments, operation 140 may be performed by the amorphous cladding preparation component 220.

In some embodiments, as mentioned above, since the melting temperature interval for melting the amorphous material (e.g., the amorphous YAG solid particle) to form the amorphous melt (e.g., the amorphous YAG melt) is lower than a melting temperature of the crystalline-phase material (e.g., the YAG single-crystal fiber), the crystalline-phase material (e.g., the YAG single crystal fiber) submerged in the amorphous melt (e.g., the amorphous YAG melt) is not corroded.

Since the amorphous melt has a certain viscosity, correspondingly, in some embodiments, the amorphous cladding around the periphery of the optical fiber may be formed by adhering the amorphous melt at a constant temperature (e.g., a specific temperature within the melting temperature interval for melting the amorphous material to form the amorphous melt).

In some embodiments, the constant temperature may include a constant temperature value. In some embodiments, the constant temperature value may include a specific temperature value within the melting temperature interval for melting the amorphous material to form the amorphous melt. Taking the amorphous YAG melt as an example, the specific temperature value may be a specific temperature value in a range of 1500° C.-1800° C. For example, the specific temperature value may be 1500° C., 1550° C., 1600° C., 1650° C., 1700° C., 1750° C., 1800° C., or the like.

In some embodiments, the constant temperature may include a constant temperature range. In some embodiments, the constant temperature range may include a specific temperature interval within the melting temperature interval for melting the amorphous material to form the amorphous melt. Taking the amorphous YAG melt as an example, the specific temperature interval may be a specific temperature interval in a range of 1500° C. to 1800° C. For example, the specific temperature interval may be a temperature interval in a range of 1500° C. to 1550° C., 1550° C. to 1600° C., 1600° C. to 1650° C., 1650° C. to 1700° C., 1700° C. to 1750° C., 1750° C. to 1800° C., or the like.

As the viscosity of the amorphous melt varies with temperature, accordingly, in some embodiments, the controlling component may adjust the viscosity of the amorphous melt by adjusting the temperature to further adjust the thickness of the amorphous cladding.

In some embodiments, the amorphous melt around the periphery of the optical fiber may be crystallized by cooling during a predetermined cooling interval to grow the amorphous cladding.

In some embodiments, the predetermined cooling interval may be controlled within a predetermined range to ensure the quality of the amorphous cladding. In some embodiments, the predetermined cooling interval may be in a range of 10° C. to 60° C. In some embodiments, the predetermined cooling interval may be in a range of 15° C. to 55° C. In some embodiments, the predetermined cooling interval may be in a range of 20° C. to 50° C. In some embodiments, the predetermined cooling interval may be in a range of 22° C. to 48° C. In some embodiments, the predetermined cooling interval may be in a range of 24° C. to 46° C. In some embodiments, the predetermined cooling interval may be in a range of 26° C. to 44° C. In some embodiments, the predetermined cooling interval may be in a range of 28° C. to 42° C. In some embodiments, the predetermined cooling interval may be in a range of 30° C. to 40° C. In some embodiments, the predetermined cooling interval may be in a range of 32° C. to 38° C. In some embodiments, the predetermined cooling interval may be in a range of 34° C. to 36° C.

In some embodiments, a cooling rate may be controlled within a predetermined range to make the thickness of the amorphous cladding uniform and to ensure the quality of the amorphous cladding. In some embodiments, the cooling rate may be in a range of 0.2° C./h to 8° C./h. In some embodiments, the cooling rate may be in a range of 0.3° C./h to 7° C./h. In some embodiments, the cooling rate may be in a range of 0.4° C./h to 6° C./h. In some embodiments, the cooling rate may be in a range of 0.5° C./h to 5° C./h. In some embodiments, the cooling rate may be in a range of 1° C./h to 4.5° C./h. In some embodiments, the cooling rate may be in a range of 1.5° C./h to 4° C./h. In some embodiments, the cooling rate may be in a range of 2° C./h to 3.5° C./h. In some embodiments, the cooling rate may be in a range of 2.5° C./h to 3° C./h.

In some embodiments, during a formation process of the amorphous cladding, a monitoring component (e.g., a monitoring component 240) may be used to monitor parameter(s) related to the amorphous cladding. Further, the controlling component (e.g., a controlling component 250) may adjust cladding formation parameter(s) in real-time based on the parameter(s) related to the amorphous cladding.

In some embodiments, the parameter(s) related to the amorphous cladding may include, but are not limited to, a growth thickness, a uniformity, a flatness of an outer surface, etc., of the amorphous cladding.

In some embodiments, the cladding formation parameter(s) may include but are not limited to, the constant temperature value, the constant temperature interval, the cooling interval, the cooling rate, a contact time between the optical fiber and the amorphous melt, or the like.

For example, if a difference in the thickness or the flatness at different positions of the amorphous cladding is higher than a predetermined range, it may indicate that the amorphous cladding is not uniform in thickness or poor in flatness. Correspondingly, the controlling component (e.g., the controlling component 250) may narrow the cooling interval and reduce the cooling rate, thereby adjusting the thickness or flatness of the amorphous cladding. For example, if the thickness of the amorphous cladding is lower than a predetermined cladding thickness, the controlling component (e.g., the controlling component 250) may increase the contact time between the optical fiber and the amorphous melt, thereby adjusting the thickness of the amorphous cladding.

In some embodiments, the cladding formation parameter(s) may be determined and/or adjusted by a machine learning model. In some embodiments, the controlling component (e.g., the controlling component 250) and/or other processing devices may train the machine learning model based on historical parameter(s) related to amorphous cladding and historical cladding formation parameter(s). An input of the machine learning model may include parameter(s) of the optical fiber (e.g., a type of the optical fiber, a size of the optical fiber, etc.) and the parameter(s) related to the amorphous cladding (e.g., the thickness of the amorphous cladding, the flatness of a surface, etc.), and an output of the machine learning model may include the cladding formation parameter(s).

In some embodiments, the input of the machine learning model may also include the environmental condition (e.g., the humidity, the temperature).

In some embodiments, the controlling component may also dynamically update the parameter(s) of the machine learning model based on updated experimental data, which enhances a comprehensive learning capability of the machine learning model to determine more accurate cladding formation parameter(s).

In some embodiments, the controlling component (e.g., the controlling component 250) may determine and/or automatically adjust the cladding formation parameter(s) based on the parameter(s) of the optical fiber, the parameter(s) related to amorphous cladding, and a trained machine learning model, thereby automatically controlling the amorphous cladding in real-time during a growth process of the amorphous cladding. In some embodiments, the cladding formation parameter(s) output by the machine learning model may be adaptively adjusted according to actual situation(s) (e.g., the environmental condition) to adapt to different actual situations.

In some embodiments, the cladding formation parameter(s) may also be determined in other manners. For example, the parameter(s) may be determined based on statistical data, empirical parameter(s), user customization, or the like.

In some embodiments, after the amorphous cladding is formed around the periphery of the optical fiber, the optical fiber with the amorphous cladding formed around the periphery may be lifted out of the amorphous melt at a predetermined lifting rate.

The predetermined lifting rate may affect the quality of the amorphous cladding, which in turn may affect the quality of a subsequently prepared single-crystal cladding. For example, a relatively low predetermined lifting rate may cause the amorphous cladding to crystallize while being lifted out of the amorphous melt, which in turn may affect the quality of the amorphous cladding. However, if the predetermined lifting rate is relatively high, the fiber with amorphous cladding formed around the periphery may crack due to a relatively large temperature gradient caused by the rapid lifting, which in turn may affect the quality of the amorphous cladding. Therefore, in some embodiments, the predetermined lifting rate may be controlled within a predetermined range to ensure the quality of the amorphous cladding. In some embodiments, the predetermined lifting rate may be in a range of 200 mm/h to 3000 mm/h. In some embodiments, the predetermined lift rate may be in a range of 300 mm/h to 2500 mm/h. In some embodiments, the predetermined lifting rate may be in a range of 400 mm/h to 2000 mm/h. In some embodiments, the predetermined lifting rate may be in a range of 500 mm/h to 1500 mm/h. In some embodiments, the predetermined lifting rate may be in a range of 600 mm/h to 1300 mm/h. In some embodiments, the predetermined lifting rate may be in a range of 700 mm/h to 1200 mm/h. In some embodiments, the predetermined lifting rate may be in a range of 800 mm/h to 1100 mm/h. In some embodiments, the predetermined lifting rate may be in a range of 900 mm/h to 1000 mm/h.

In some embodiments, a post-heating process may be performed on the optical fiber formed with the amorphous cladding during the lifting process. In some embodiments, the post-heating process may be performed by a post-heating assembly (e.g., a resistive heating assembly, an inductive heating assembly, etc.). The post-heating process may create a temperature field to prevent the optical fiber with the amorphous cladding formed around the periphery from cracking due to an excessively large temperature gradient when the optical fiber is lifted out of the amorphous melt. In embodiments of the present disclosure, the terms "temperature field" and "temperature gradient" may be used interchangeably unless otherwise noted. In some embodiments, the temperature field formed in the post-heating process may be a temperature field with an increasing temperature gradient along an axial direction (i.e., a lifting direction), a temperature field with a decreasing temperature gradient along the axial direction, or a temperature field with a constant temperature gradient along the axial direction.

In 150, a crystallization process may be performed on the amorphous cladding to obtain the single-crystal cladding. In some embodiments, operation 150 may be performed by a single-crystal cladding preparation component 230.

In some embodiments, the crystallization process may include an arc discharge process. In some embodiments, the arc discharge process refers to performing the crystallization process on the amorphous cladding using a high temperature generated by an arc discharge plasma. In some embodiments, the controlling component may adjust a temperature generated by the arc discharge plasma by adjusting a voltage or a current. In some embodiments, the temperature (which may be referred to as a "crystallization temperature") may be lower than the melting temperature of the amorphous cladding to prevent re-melting of the amorphous cladding. In some embodiments, the arc discharge process may be performed by an arc discharge assembly (e.g., an arc discharge assembly 231). The arc discharge process can concentrate energy, heat up quickly, enhance crystallization efficiency, and a shape of the arc discharge can be adapted to a shape (e.g., a columnar shape) of the optical fiber formed with the amorphous cladding, ensuring a more thorough crystallization process and improving consistency of the crystallization process.

In some embodiments, the crystallization process may also include other modes of processes, for example, a heating process, a laser annealing process, or the like.

The following description takes performing the crystallization process on the YAG amorphous cladding to obtain a YAG single-crystal cladding as an example.

In some embodiments, to improve an efficiency of the crystallization process and to ensure the quality of the single-crystal cladding, a temperature of the crystallization process may be controlled within a predetermined range. In some embodiments, the temperature of the crystallization process may be in a range of 1000° C. to 1500° C. In some embodiments, the temperature of the crystallization process may be in a range of 1050° C. to 1450° C. In some embodiments, the temperature of the crystallization process may be in a range of 1100° C. to 1400° C. In some embodiments, the temperature of the crystallization process may be in a range of 1150° C. to 1350° C. In some embodiments, the temperature of the crystallization process may be in a range of 1200° C. to 1300° C.

In some embodiments, a processing time of the crystallization process may be determined based on the thickness of the amorphous cladding.

In some embodiments, flowing oxygen may be introduced while performing the crystallization process on the amorphous cladding to avoid oxygen defects in the single-crystal cladding, thereby further improving the quality of the single-crystal cladding.

In some embodiments, an oxygen-flowing rate may be controlled within a predetermined range to ensure the quality of the single-crystal cladding. In some embodiments, the oxygen-flowing rate may be in a range of 1 L/min to 20 L/min. In some embodiments, the oxygen-flowing rate maybe in a range of 2 L/min to 19 L/min. In some embodiments, the oxygen-flowing rate maybe in a range of 3 L/min to 18 L/min. In some embodiments, the oxygen-flowing rate maybe in a range of 4 L/min to 17 L/min. In some embodiments, the oxygen-flowing rate may be in a range of 5 L/min to 16 L/min. In some embodiments, the oxygen-flowing rate maybe in a range of 6 L/min to 15 L/min. In some embodiments, the oxygen-flowing rate maybe in a range of 7 L/min to 14 L/min. In some embodiments, the oxygen-flowing rate maybe in a range of 8 L/min to 13 L/min. In some embodiments, the oxygen-flowing rate maybe in a range of 9 L/min to 12 L/min. In some embodiments, the oxygen-flowing rate maybe in a range of 10 L/min to 11 L/min.

In some embodiments, a crystallizing agent layer may be deposited around the periphery of the amorphous cladding and the crystallization process may be performed on an amorphous cladding deposited with the crystallizing agent layer.

In some embodiments, a crystallizing agent may include but is not limited to, MgO, $Ga_2O_3$, $Cr_2O_3$, $ZrO_2$, $La_2O_3$, or the like.

In some embodiments, a suspension may be formed by mixing the crystallizing agent with ethanol or water at a predetermined mass ratio. Further, the amorphous cladding may be submerged in the suspension to deposit the crystallizing agent layer around the periphery of the amorphous cladding. In some embodiments, the crystallizing agent layer refers to a liquid film comprising a crystallizing agent formed by the attachment of the suspension to the periphery of the amorphous cladding.

In some embodiments, to make the crystallizing agent layer stably deposited around the periphery of the amorphous cladding such that the crystallization process may be performed to obtain a high-quality single-crystal cladding, the predetermined mass ratio may be controlled within a predetermined range. In some embodiments, the predetermined mass ratio may be in a range of 1:2 to 1:26. In some embodiments, the predetermined mass ratio may be in a range of 1:3 to 1:24. In some embodiments, the predetermined mass ratio may be in a range of 1:4 to 1:22. In some embodiments, the predetermined mass ratio may be in a range of 1:5 to 1:20. In some embodiments, the predetermined mass ratio may be in a range of 1:6 to 1:18. In some embodiments, the predetermined mass ratio may be in a range of 1:7 to 1:16. In some embodiments, the predetermined mass ratio may be in a range of 1:8 to 1:14. In some embodiments, the predetermined mass ratio may be in a range of 1:9 to 1:12. In some embodiments, the predetermined mass ratio may be in a range of 1:10 to 1:11.

In the crystallization process, the optical fiber may be used as a seed layer or a substrate for the crystallization process of the amorphous cladding, so that the crystallization process may be performed from an outer surface of the optical fiber (or an inner surface of the amorphous cladding) to an outer surface of the amorphous cladding. By introducing the crystallizing agent layer, the crystallization process may be performed from the outer surface of the amorphous cladding to the inner surface of the amorphous cladding (or the outer surface of the optical fiber). That is to say, by introducing the crystallizing agent layer, the crystallization process of the amorphous cladding may be performed simultaneously from the inner surface and the outer surface of the amorphous cladding to a middle part of the amorphous cladding, which can accelerate the crystallization process of the amorphous cladding, shorten crystallization time, and improve crystallization efficiency.

In some embodiments, after the crystallization process of the amorphous cladding, an outer periphery of the single-crystal cladding may be cleaned to remove a residual crystallizing agent layer around the outer periphery of the single-crystal cladding. In some embodiments, a cleaning manner may include but is not limited to, immersion, ultrasonic oscillation, or the like.

It should be noted that the descriptions of process 100 are intended to be exemplary and illustrative only and do not limit the scope of application of the present disclosure. For those skilled in the art, various modifications and changes may be made to process 100 under the guidance of the present disclosure. However, these modifications and changes remain within the scope of the present disclosure. For example, process 100 may also be used to prepare other claddings and is not limited to the YAG single-crystal cladding. As another example, after the raw material is melted to form the raw material melt, the raw material melt may be cooled rapidly at a relatively high cooling rate to form the amorphous material.

Figure 2:
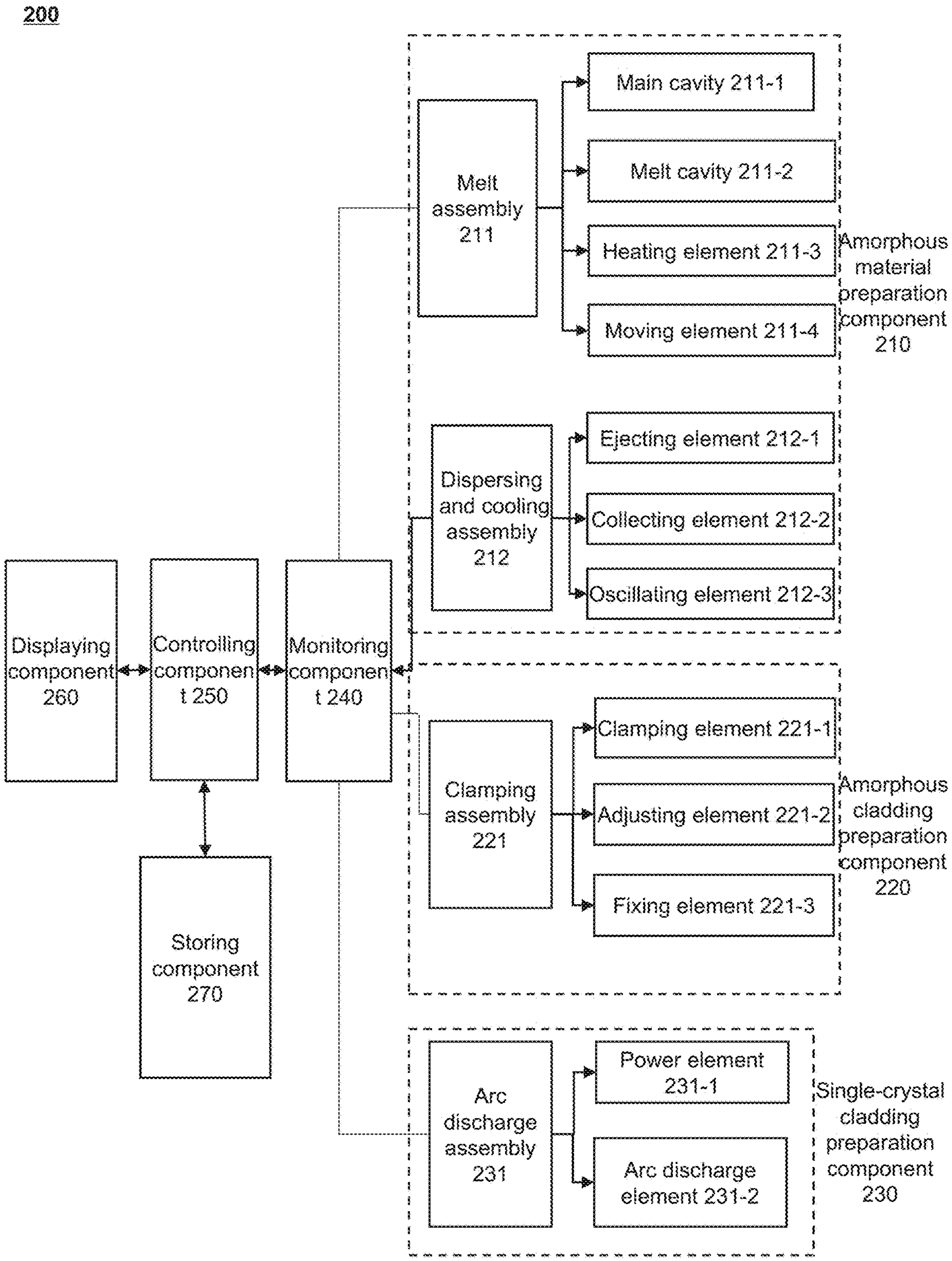
FIG. 2 is a schematic diagram illustrating an exemplary device for preparing a single-crystal cladding according to some embodiments of the present disclosure.

FIG. 2 is a schematic diagram illustrating an exemplary device for preparing a single-crystal cladding according to some embodiments of the present disclosure.

In some embodiments, a device 200 for preparing a single-crystal cladding may include the amorphous material preparation component 210, the amorphous cladding preparation component 220, and the single-crystal cladding preparation component 230.

The amorphous material preparation component 210 may be used to prepare an amorphous material. More descriptions regarding preparing the amorphous material may be found elsewhere (e.g., FIG. 1 and the related descriptions thereof) in the present disclosure.

In some embodiments, the amorphous material preparation component 210 may include the melt assembly 211 and the dispersing and cooling assembly 212.

In some embodiments, the melt assembly 211 may be used to melt a raw material to form a raw material melt. In some embodiments, the melt assembly 211 may include a main cavity 211-1, a melt cavity 211-2, a heating element 211-3, and a moving element 211-4. More description regarding the melt assembly may be found in FIG. 3 and the related descriptions thereof.

In some embodiments, the dispersing and cooling assembly 212 may be used to perform a dispersing and cooling process on the raw material melt to form the amorphous material. In some embodiments, the dispersing and cooling assembly 212 may include an ejecting element 212-1, a collecting element 212-2, and an oscillating element 212-3. More description regarding the dispersing and cooling assembly may be found in FIG. 4 and the related descriptions thereof.

The amorphous cladding preparation component 220 may be used to melt the amorphous material to form an amorphous melt, submerge an optical fiber in the amorphous melt, and form an amorphous cladding around a periphery of the optical fiber based on the amorphous melt and the optical fiber. More descriptions regarding forming the amorphous cladding may be found elsewhere (e.g., FIG. 1 and the related descriptions thereof) in the present disclosure.

In some embodiments, the amorphous cladding preparation component 220 may include a clamping assembly 221 and a cladding preparation cavity (not shown in the figures).

In some embodiments, the cladding preparation cavity may be used to melt the amorphous material to form the amorphous melt.

In some embodiments, the clamping assembly 221 may be used to clamp the optical fiber and submerge the optical fiber in the amorphous melt. In some embodiments, the clamping assembly 221 may include a clamping element 221-1, an adjusting element 221-2, and a fixing element 221-3. More descriptions regarding the clamping assembly may be found in FIG. 5A and FIG. 5B and the related descriptions thereof.

The single-crystal cladding preparation assembly 230 may be used to perform a crystallization process on the amorphous cladding to obtain a single-crystal cladding. More descriptions regarding performing the crystallization process on the amorphous cladding to obtain the single-crystal cladding may be found elsewhere (e.g., FIG. 1 and the related descriptions thereof) in the present disclosure.

In some embodiments, the single-crystal cladding preparation assembly 230 may include an arc discharge assembly 231.

In some embodiments, the arc discharge assembly 231 may be used to perform an arc discharge process on the amorphous cladding. In some embodiments, the arc discharge assembly 231 may include a power element 231-1 and an arc discharge element 231-2. More description regarding the arc discharge assembly may be found in FIG. 6A and FIG. 6B and the related descriptions thereof.

In some embodiments, the device 200 for preparing the single-crystal cladding may further include a monitoring component 240 and a controlling component 250. The monitoring component 240 may be used to monitor parameter(s) related to the amorphous cladding. The controlling component 250 may be used to adjust cladding formation parameter(s) in real-time based on parameter(s) related to the amorphous cladding. In some embodiments, the controlling component 250 may be used to train the machine learning model described above. More descriptions regarding the parameter(s) related to the amorphous cladding, adjusting the cladding formation parameter(s) based on the parameter(s) in real-time, and training the machine learning model may be found elsewhere (e.g., FIG. 1 and the related descriptions thereof) in the present disclosure.

In some embodiments, the device 200 for preparing the single-crystal cladding may further include a displaying component 260 for displaying melting-related parameter(s), parameter(s) of the cooling process, the parameter(s) related to the amorphous cladding, or the like.

In some embodiments, the device 200 for preparing the single-crystal cladding may further include a storing component 270 for storing experimental data, statistical data, machine learning models, or the like.

It should be noted that the descriptions of the device 200 for preparing the single-crystal cladding are for the purpose of exemplification and illustration only and does not limit the scope of the present disclosure. For those skilled in the art, various modifications and changes may be made to the device 200 for preparing the single-crystal cladding under the guidance of the present disclosure. However, these modifications and changes remain within the scope of the present disclosure.

Figure 3:
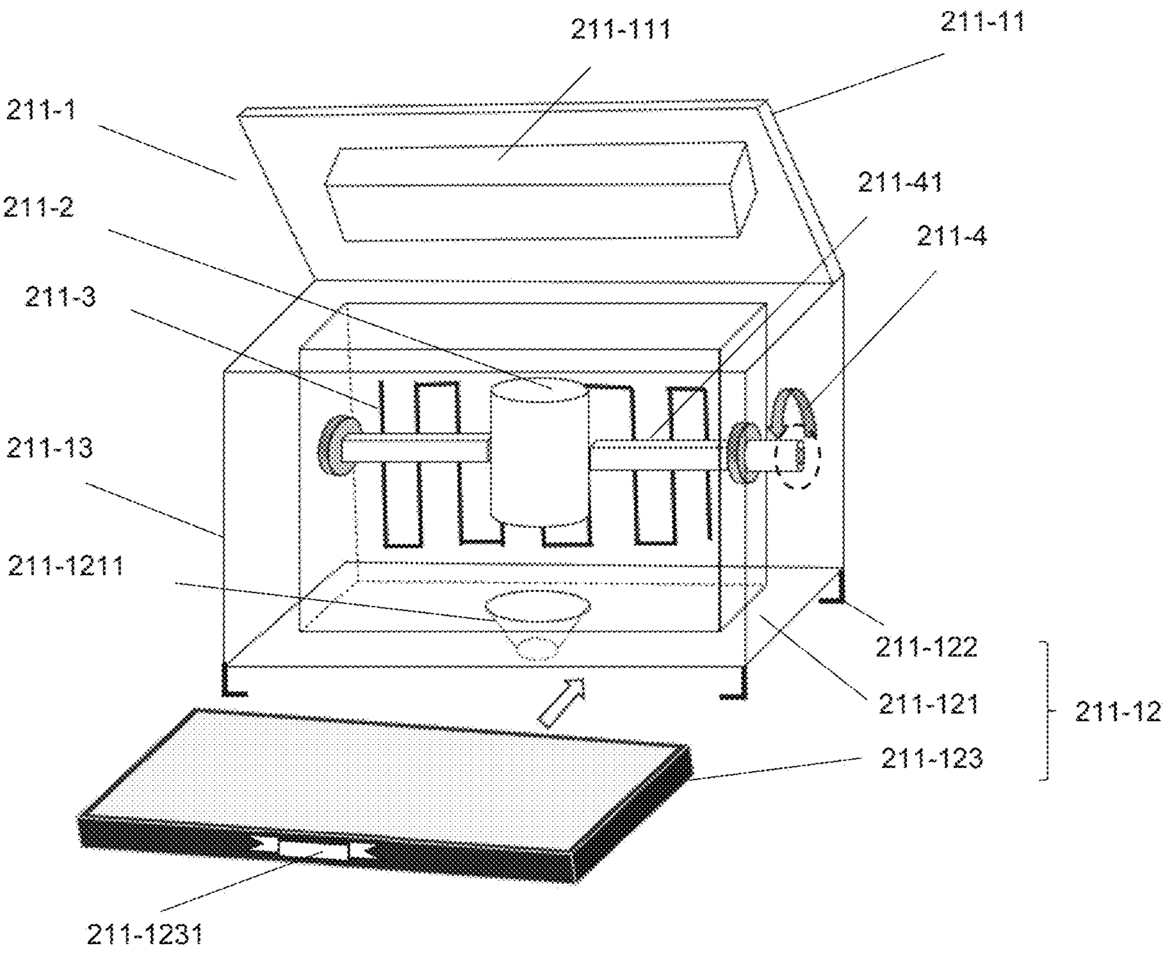
FIG. 3 is a schematic diagram illustrating an exemplary structure of a melt assembly according to some embodiments of the present disclosure.

FIG. 3 is a schematic diagram illustrating an exemplary structure of a melt assembly according to some embodiments of the present disclosure.

As shown in FIG. 3, the melt assembly 211 may include a main cavity 211-1, a melt cavity 211-2, a heating element 211-3, and a moving element 211-4.

In some embodiments, the main cavity 211-1 may be a place to accommodate each element of the melt assembly 211. In some embodiments, a shape of the main cavity 211-1 may include but is not limited to, a cylindrical shape, a rectangular shape, a cubic shape, etc. In some embodiments, the main cavity 211-1 may be sealed.

In some embodiments, the main cavity 211-1 may be provided with an insulation layer for insulating the main cavity 211-1. In some embodiments, a material of the insulation layer may include, but is not limited to, an insulation material such as graphite felt, zirconia felt, an insulation brick, or the like.

In some embodiments, the main cavity 211-1 may include a cavity upper cover 211-11, a cavity lower cover 211-12, and a middle cavity 211-13. In some embodiments, shapes and sizes of the cavity upper cover 211-11 and the cavity lower cover 211-12 may match the middle cavity 211-13, thereby sealing the main cavity 211-1.

In some embodiments, the cavity upper cover 211-11 may be provided with a boss 211-111 on an inner side of the cavity upper cover 211-11. In some embodiments, the cavity upper cover 211-11 and/or the boss 211-111 may be made of an insulating material. In some embodiments, a size of the boss 211-111 may match an upper part of the middle cavity 211-13 to reduce an excess space in the middle part 211-13 and improve an insulation effect.

In some embodiments, the cavity lower cover 211-12 may be made of an insulating material. In some embodiments, the cavity lower cover 211-12 may include a cavity lower plate 211-121, a cavity lower cover support 211-122, and a cavity lower cover body 211-123.

In some embodiments, the cavity lower plate 211-121 may be provided with an opening 211-1211 penetrating through the cavity lower plate 211-121 for a raw material melt to pass through, facilitating a subsequent dispersing and cooling process performed on the raw material melt to form an amorphous material.

In some embodiments, the cavity lower cover support 211-122 may be uniformly or non-uniformly distributed on the cavity lower plate 211-121.

In some embodiments, the cavity lower cover body 211-123 may be made of an insulating material. The cavity lower cover body 211-123 may be provided with a pull tab 211-1231. In some embodiments, the pull tab 211-1231 may be used to place the cavity lower cover body 211-123 on a lower part of the cavity lower plate 211-121 and cause the cavity lower cover body 211-123 to snap onto the cavity lower cover support 211-122, thereby sealing the middle cavity 211-13. In some embodiments, the cavity lower cover body 211-123 may be removed from the cavity lower cover support 211-122 using the pull tab 211-1231, facilitating a passage of the raw material melt through the opening 211-1211 for the subsequent dispersing and cooling process.

In some embodiments, the melt cavity 211-2 may be used to place and melt the raw material. In some embodiments, the melt cavity 211-2 may be located inside the main cavity 211-1. In some embodiments, a material of the melt cavity 211-2 may include but is not limited to at least one of graphite, quartz, alumina, zirconia, iridium, platinum, tungsten, tantalum, or molybdenum.

In some embodiments, the heating element 211-3 may be used to heat the melt cavity 211-2 to melt the raw material. In some embodiments, a heating mode of the heating element 211-3 may include but is not limited to resistance heating, induction heating, or the like. In some embodiments, when the heating element 211-3 is a resistance heating element, the heating element 211-3 may include but is not limited to a high resistance graphite, a molybdenum silica ($MoSi_2$) rod, a nickel-chromium (Ni—Cr) wire, a ferro-chromium aluminum (Fe—Cr—Al) wire, a nickel-iron (Ni—Fe) wire, a nickel-copper (Ni—Cu) wire, a silicon carbide (SiC) rod, or the like.

In some embodiments, the moving element 211-4 may be used to drive the melt cavity 211-2 to move. In some embodiments, the moving element 211-4 may be used to drive the melt cavity 211-2 to tilt at a predetermined angle, causing the raw material melt inside the melt cavity 211-2 to dump out to pass through the opening 211-1211.

In some embodiments, the moving element 211-4 may include a connecting rod 211-41. In some embodiments, the middle cavity 211-13 may be provided with a through-hole through which the connecting rod 211-41 passes. One end of the connecting rod 211-41 may be fixedly connected to the melt cavity 211-2, and the other end may pass through the through-hole on the middle cavity 211-13.

In some embodiments, the connecting rod 211-41 may be rotated manually (e.g., by a wrench) to drive the melt cavity 211-2 to move.

In some embodiments, the moving element 211-4 may also include a driving element (not shown in the figures). The driving element may be used to drive the connecting rod 211-41 to move, thereby driving the melt cavity 211-2 to move.

Figure 4:
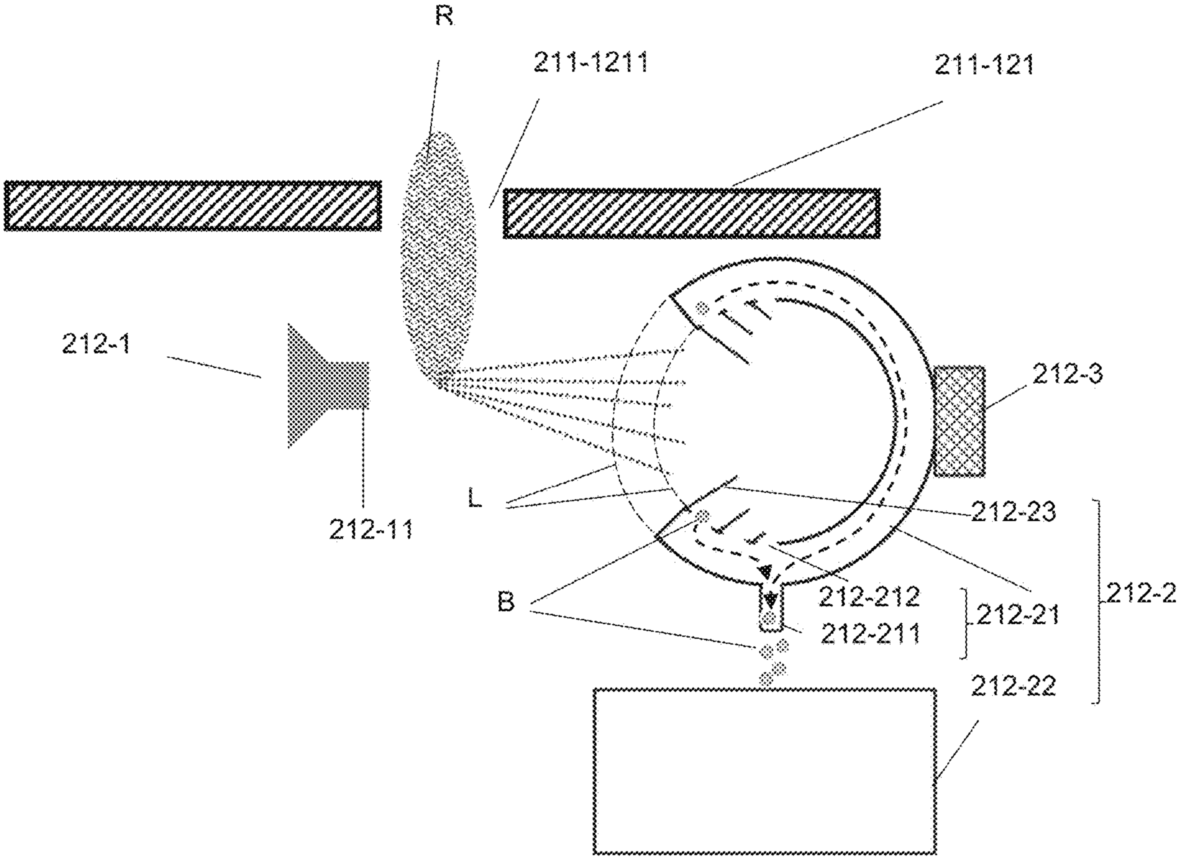
FIG. 4 is a schematic diagram illustrating an exemplary structure of a dispersing and cooling assembly according to some embodiments of the present disclosure.

FIG. 4 is a schematic diagram illustrating an exemplary structure of a dispersing and cooling assembly according to some embodiments of the present disclosure.

As shown in FIG. 4, the dispersing and cooling assembly 212 may include an ejecting element 212-1 and a collecting element 212-2.

In some embodiments, the ejecting element 212-1 may be used to eject a fluid. In some embodiments, the ejecting element 212-1 may include an ejecting body (not shown in the figures) and an ejection port 212-11. In some embodiments, as shown in FIG. 4, the fluid may be ejected from the ejection port 212-11 to perform a dispersing and cooling process on a raw material melt R flowing out of the melt assembly 211 (e.g., the opening 211-1211) to obtain an amorphous material.

In some embodiments, the collecting element 212-2 may be used to collect the amorphous material. In some embodiments, the collecting element 212-2 may include a collecting body 212-21, a collecting frame 212-22, and a baffle plate 212-23.

In some embodiments, the collecting body 212-21 may be an annular cavity with a hollow interior having a partial opening (as shown by a dashed line L in FIG. 4). In some embodiments, an opening curvature of the collecting body 212-21 (as shown by the dashed line L in FIG. 4) may be determined based on a distance between the ejection port 212-11 and the collecting body 212-21, an ejection angle, an ejection pressure, or the like. In some embodiments, a material of the collecting body 212-21 may include but is not limited to a material that has a high thermal conductivity graphite such as copper, aluminum, silver, or the like, so that at a portion of fine amorphous melts may be further cooled to form amorphous solid particles.

In some embodiments, a collecting port 212-211 may be provided on a lower outer side of the annular cavity of the collecting body 212-21.

In some embodiments, the collecting frame 212-22 may be provided in a lower part of the collecting port 212-211 for collecting the amorphous material (e.g., the fine amorphous melts and the amorphous solid particles).

In some embodiments, the baffle plate 212-23 may be evenly or unevenly disposed on an inner inside of the annular cavity of the collecting body 212-21, as shown in FIG. 4. In some embodiments, holes 212-212 may be provided on the baffle plate 212-23 on the inner side of the collecting body 212-21 such that the fine amorphous melts and/or the amorphous solid particles (as shown by B in FIG. 4) obtained after a dispersing and cooling process may pass through the holes 212-212 to enter into an interior of the collecting cavity 212-21 after being decelerated by colliding with the baffle plate 212-23, and then enter the collecting frame 212-22 through the collecting port 212-211.

In some embodiments, the dispersing and cooling member 212 may further include an oscillating element 212-3 for oscillating the amorphous material (e.g., the amorphous melts and the amorphous solid particles) after the dispersing and cooling process during a collecting process, which can prevent the fine amorphous melts and/or the amorphous solid particles from adhering to an inner wall of the dispersing and cooling assembly 212 (e.g., the collecting body 212-21), thereby improving a utilization rate of the raw material.

In some embodiments, the oscillating element 212-3 may be provided on the collecting body 212-21. In some embodiments, the oscillating element 212-3 may include, but is not limited to, an oscillator.

Figure 5A:
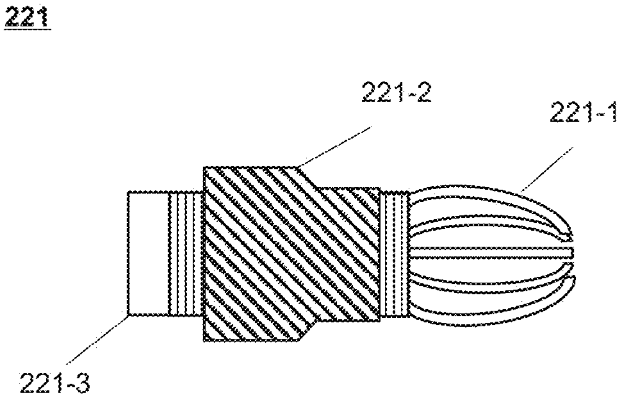
FIG. 5A is a schematic diagram illustrating an exemplary structure of a clamping assembly according to some embodiments of the present disclosure.
Figure 5B:
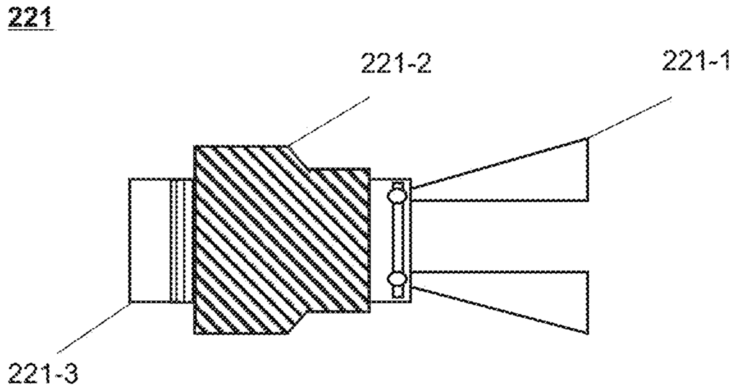
FIG. 5B is a schematic diagram illustrating an exemplary structure of a clamping assembly according to other embodiments of the present disclosure.

FIG. 5A is a schematic diagram illustrating an exemplary structure of a clamping assembly according to some embodiments of the present disclosure. FIG. 5B is a schematic diagram illustrating an exemplary structure of a clamping assembly according to other embodiments of the present disclosure.

In some embodiments, the clamping assembly 221 may include a clamping element 221-1, an adjusting element 221-2, and a fixing element 221-3.

In some embodiments, the clamping element 221-1 may include at least two clamping rods. The at least two clamping rods may be evenly disposed at one end of the fixing element 221-3. In some embodiments, as shown in FIG. 5A, a side of the clamping rod that clamps an optical fiber may have a curvature. In some embodiments, a side of the clamping rod that clamps the optical fiber may not have a curvature, as shown in FIG. 5B.

In some embodiments, the adjusting element 221-2 may match the fixing element 221-3 to adjust an opening or closing degree of the clamping element 221-1 to stably clamp the optical fiber.

In some embodiments, the adjusting element 221-2 may be disposed around a periphery of the fixing element 221-3, as shown in FIG. 5A and FIG. 5B. In some embodiments, the periphery of the fixing element 221-3 may be provided with an external thread, and an inner side of the adjusting element 221-2 may be provided with an internal thread. The external thread and the internal thread may be adapted to each other. By adjusting (e.g., rotating clockwise or counterclockwise) a screwing-in or screwing-out of the adjusting element 221-2 on the fixing element 221-3, one end of the adjusting element 221-2 may adjust the opening or closing degree of the clamping element 221-1.

Figure 6A:
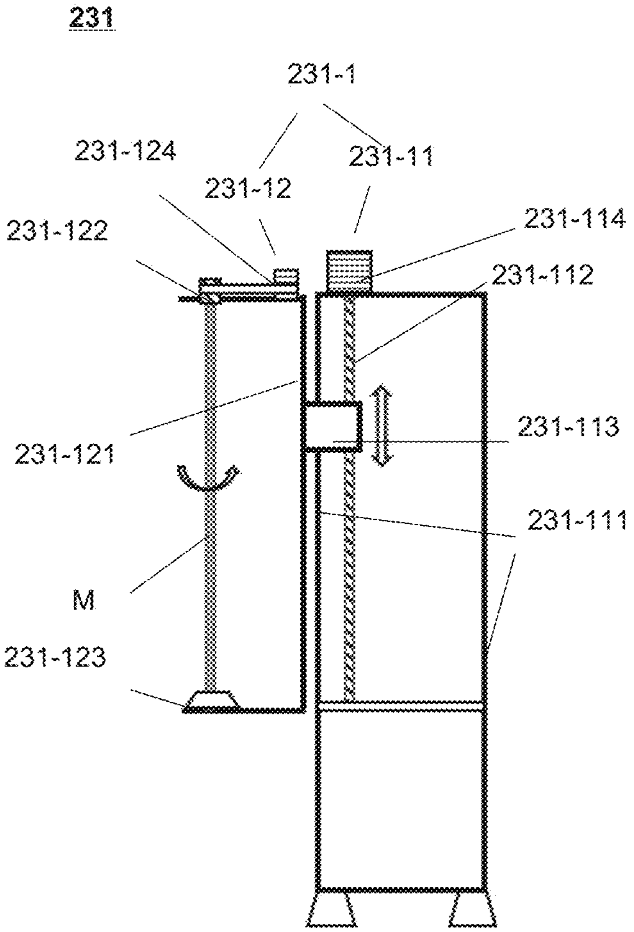
FIG. 6A is a schematic diagram illustrating an exemplary structure of a power element according to some embodiments of the present disclosure.
Figure 6B:
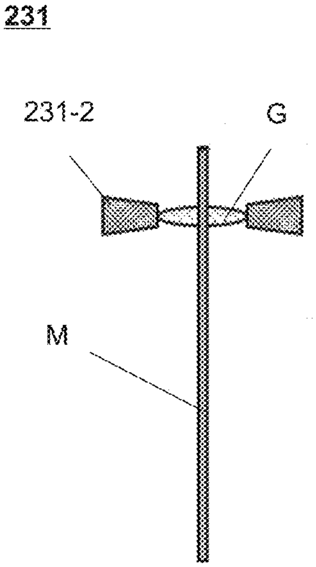
FIG. 6B is a schematic diagram illustrating an exemplary structure of an arc discharge element according to some embodiments of the present disclosure.

FIG. 6A is a schematic diagram illustrating an exemplary structure of a power element according to some embodiments of the present disclosure. FIG. 6B is a schematic diagram illustrating an exemplary structure of an arc discharge element according to some embodiments of the present disclosure.

In some embodiments, the arc discharge assembly 231 may include a power element 231-1 and an arc discharge element 231-2.

In some embodiments, the power element 231-1 may be used to drive an optical fiber M formed with an amorphous cladding for an up-and-down movement and/or rotational movement. In some embodiments, the power element 231-1 may include an up-and-down movement driving member 231-11 and a rotational movement driving member 231-12.

In some embodiments, the up-and-down movement driving member 231-11 may include a support 231-111, a screw 231-112, a slider 231-113, and a first driving motor 231-114. The up-and-down movement driving member 231-11 may be configured to drive the optical fiber M formed with the amorphous cladding to move up and down.

In some embodiments, the support 231-111 may be used to support the screw 231-112, the slider 231-113, and the first driving motor 231-114.

In some embodiments, the screw 231-112 may be provided on the support 231-111. In some embodiments, the screw 231-112 may be disposed parallel to some rods of the support 231-111.

In some embodiments, the slider 231-113 may be sheathed on the screw 231-112. In some embodiments, one end of the slider 231-113 may be connected (e.g., welded) to the rotational movement driving member 231-12 (e.g., a support bracket 231-121).

In some embodiments, the first driving motor 231-114 may be used to drive the screw 231-112 to rotate, thereby causing the slider 231-113 to move up and down along the screw 231-112, which further drives the rotational movement driving member 231-12 to move up and down.

In some embodiments, the rotational movement driving member 231-12 may include the support bracket 231-121, a connecting member 231-122, a stabilizing member 231-123, and a second driving motor 231-124. The rotational movement driving member 231-12 may be configured to drive the optical fiber M formed with the amorphous cladding to rotate.

In some embodiments, the support bracket 231-121 may be used to support and stabilize the optical fiber M formed with the amorphous cladding. In some embodiments, a height of the support bracket 231-121 may be adapted to the optical fiber M formed with the amorphous cladding.

In some embodiments, the connecting member 231-122 may be used to connect and secure the optical fiber M formed with the amorphous cladding. In some embodiments, the connecting member 231-122 may be connected (e.g., welded) to the support bracket 231-121. In some embodiments, a structure of the connecting member 231-122 may be the same or different from the clamping assembly 221.

In some embodiments, the stabilizing member 231-123 may be connected (e.g., welded) to the support bracket 231-121. In some embodiments, the stabilizing member 231-123 may be provided with a recessed hole that is adapted to the optical fiber M formed with the amorphous cladding for stabilizing the optical fiber M formed with the amorphous cladding and preventing the optical fiber M from deflection.

In some embodiments, the second driving motor 231-124 may be used to drive the connecting member 231-122 to rotate via a transmission member (e.g., a belt, a rack, etc.), thereby driving the optical fiber M formed with the amorphous cladding to rotate.

In some embodiments, the arc discharge element 231-2 may be used to perform an arc discharge process on the amorphous cladding to form a high-temperature region G around a periphery of the amorphous cladding.

Example 1

$Y_2O_3$ powder and $Al_2O_3$ powder both with a purity greater than 99.9% were weighed in accordance with a stoichiometric ratio, and put into a crucible after mixing evenly. The crucible was placed in a muffle furnace for calcination at a temperature in a range of 1400° C. to 1700° C. for a calcination time of 5 h to 25 h, and YAG polycrystalline powder was produced.

The YAG polycrystalline powder was subjected to a heating process at a heating rate of 1° C./min to 12° C./min, and flowing argon and nitrogen with a flow rate of 1 L/min to 5 L/min were introduced during the heating process. The temperature was increased to a range of 1900° C. to 2100° C., and the heat was insulated for 2 h to 12 h to obtain a YAG melt.

The YAG melt was poured out, an ejecting element was activated, and the YAG melt was dispersed and cooled by liquid nitrogen ejected by the ejecting element, so that fine amorphous YAG melts and amorphous YAG solid particles were obtained. An ejection angle was 20°-70°, an ejection pressure was 0.1 MPa to 2.5 MPa, and a distance between an ejection port of the ejecting element and the YAG melt was between 3 cm and 12 cm. The amorphous YAG melt and the amorphous YAG solid particles were oscillated during the dispersing and cooling process.

The amorphous YAG melt and the amorphous YAG solid particles were melted at a temperature in a range of 1500° C. to 1800° C. and insulated for 2 h to 15 h to obtain an amorphous YAG melt.

A core of a YAG-doped single-crystal optical fiber was clamped using a clamping assembly and submerged in the amorphous YAG melt at an angle of 0° to 15° relative to a horizontal plane. A temperature of the amorphous YAG melt was maintained in a range of 1500° C. to 1800° C., causing the amorphous YAG melt to adhered to an outer periphery of the core of the YAG-doped single-crystal optical fiber, forming an amorphous YAG cladding.

A YAG-doped single-crystal optical fiber with an amorphous YAG cladding formed around the periphery was lifted out of the amorphous YAG melt at a lifting rate of 200 mm/h to 3000 mm/h and submerged in a suspension to deposit a crystallizing agent layer around the periphery of the amorphous YAG cladding. The suspension was formed by mixing MgO with ethanol in a mass ratio of 1:2 to 1:26. The amorphous YAG cladding deposited with the crystallizing agent layer was heated for a crystallization process at a crystallization temperature of 1000° C. to 1500° C. for a crystallization time of 2 to 5 days, and a YAG single-crystal cladding was obtained. During the crystallization process, flowing oxygen with a flow rate of 1 L/min to 20 L/min was introduced. The YAG single-crystal cladding was placed in deionized water and ultrasonically oscillated to remove a residual crystallizing agent layer around the periphery of the YAG single-crystal cladding.

Beneficial effects provided by the embodiments of the present disclosure may include the followings. (1) The method for preparing a single-crystal cladding is simple and convenient without introducing impurities (e.g., fluxes) during a preparation process, which is non-polluting with low energy consumption. (2) The device for preparing the single-crystal cladding is simple, does not require a high-pressure device, and is easy to operate and maintain. (3) A high-quality amorphous material can be obtained through a rapid dispersing and cooling process by ejecting a fluid to a melt, thereby preparing a high-quality amorphous cladding and a single-crystal cladding. (4) The quality of the single-crystal cladding is enhanced by monitoring, controlling, and adjusting preparation parameter(s) throughout the preparation process. (5) By introducing the crystallizing agent layer, the crystallization process of the amorphous cladding can be performed from the inner surface and the outer surface of the amorphous cladding to the middle part of the amorphous cladding simultaneously, which can speed up the crystallization process of the amorphous cladding, shorten the crystallization time, and improve an efficiency of the crystallization process.

It should be noted that the beneficial effects that may arise from different embodiments may be different. In different embodiments, the beneficial effects may be a combination of any one or more of the above, or any other possible beneficial effects that may be obtained.

The basic concepts have been described above, and it is apparent to those skilled in the art that the foregoing detailed disclosure serves only as an example and does not constitute a limitation of the present disclosure. While not expressly stated herein, a person skilled in the art may make various modifications, improvements, and amendments to the present disclosure. Those types of modifications, improvements, and amendments are suggested in the present disclosure, so those types of modifications, improvements, and amendments remain within the spirit and scope of the exemplary embodiments of the present disclosure.

Also, the present disclosure uses specific words to describe embodiments of the present disclosure. Words such as "an embodiment," "one embodiment," and/or "some embodiment" refer to a feature, structure, or characteristic associated with at least one embodiment of the present disclosure. Accordingly, it should be emphasized and noted that "an embodiment," or "one embodiment," or "an alternative embodiment" mentioned two or more times in different places in the present disclosure do not necessarily refer to the same embodiment. In addition, certain features, structures, or characteristics in one or more embodiments of the present disclosure may be suitably combined.

Additionally, unless expressly stated in the claims, the order of the processing elements and sequences, the use of numerical letters, or the use of other names as described in the present disclosure are not intended to qualify the order of the processes and methods of the present disclosure. While some embodiments of the invention that are currently considered useful are discussed in the foregoing disclosure by way of various examples, it should be appreciated that such details serve only illustrative purposes and that additional claims are not limited to the disclosed embodiments, rather, the claims are intended to cover all amendments and equivalent combinations that are consistent with the substance and scope of the embodiments of the present disclosure. For example, although the implementation of various components described above may be embodied in a hardware device, it may also be implemented as a software only solution, e.g., an installation on an existing server or a mobile device.

Similarly, it should be noted that in order to simplify the presentation of the disclosure of the present disclosure, and thereby aid in the understanding of one or more embodiments of the present disclosure, the foregoing descriptions of embodiments of the present disclosure sometimes group multiple features in a single embodiment, accompanying drawings, or a description thereof. However, this manner of disclosure does not imply that the subject matters of the present disclosure require more features than those mentioned in the claims. Rather, claimed subject matters may lie in less than all features of a single foregoing disclosed embodiment.

Some embodiments use numbers to describe the number of components, attributes, and it should be understood that such numbers used in the description of the embodiments are modified in some examples by the modifiers such as "about," "approximately," or "substantially," Unless otherwise noted, the terms "about," "approximate," or "substantially" indicate that a ±20% variation in the stated number is allowed. Correspondingly, in some embodiments, the numerical parameters used in the present disclosure and claims are approximations, which are subject to change depending on the desired characteristics of individual embodiments. In some embodiments, the numerical parameters should take into account the specified number of valid digits and employ general place-keeping. While the numerical domains and parameters used to confirm the breadth of their ranges in some embodiments of the present disclosure are approximations, in specific embodiments, such values are set to be as precise as possible within a feasible range.

For each patent, patent application, patent application disclosure, and other material cited in the present disclosure, such as articles, books, specification sheets, publications, documents, etc., the entire contents of each of which are hereby incorporated herein by reference. Except for application history documents that are inconsistent with or create a conflict with the contents of the present disclosure, and except for documents that limit the broadest scope of the claims of the present disclosure (currently or hereafter appended to the present disclosure). It should be noted that in the event of any inconsistency or conflict between the descriptions, definitions, and/or use of terminologies in the materials appended to the present disclosure and those outlined in the present disclosure, the descriptions, definitions, and/or use of terms in the present disclosure shall prevail.

Finally, it should be understood that the embodiments described herein are only used to illustrate the principles of the embodiments of the present disclosure. Other deformations may also fall within the scope of the present disclosure. As such, alternative configurations of embodiments of the present disclosure may be viewed as consistent with the teachings of the present disclosure as an example, not as a limitation. Correspondingly, the embodiments of the present disclosure are not limited to the embodiments expressly presented and described herein.

What is claimed is:

1. A method for preparing a single-crystal cladding without introducing fluxes, comprising:
- preparing an amorphous material;
- melting the amorphous material to form an amorphous melt;
- submerging an optical fiber that is a crystal in the amorphous melt;
- forming an amorphous cladding around a periphery of the optical fiber based on the amorphous melt and the optical fiber; and
- obtaining the single-crystal cladding by performing a crystallization process on the amorphous cladding.

2. The method of claim 1, wherein
- a melting temperature interval for melting the amorphous material to form the amorphous melt is lower than a melting temperature of the optical fiber.

3. The method of claim 1, wherein the preparing an amorphous material includes:
- melting a raw material to form a raw material melt; and
- dispersing and cooling the raw material melt by ejecting a fluid to form the amorphous material.

4. The method of claim 3, wherein an angle between an ejection direction of the fluid and a horizontal plane is in a range of 20° to 70°, or
- an ejection pressure of the fluid is in a range of 0.1 MPa to 2.5 MPa.

5. The method of claim 3, wherein a distance between an ejection port of the fluid and the raw material melt is in a range of 3 cm to 12 cm.

6. The method of claim 3, wherein the preparing an amorphous material further includes:
- collecting the amorphous material and oscillating the amorphous material when collecting the amorphous material.

7. The method of claim 1, wherein the submerging an optical fiber in the amorphous melt includes:
- submerging the optical fiber horizontally in the amorphous melt.

8. The method of claim 1, wherein the forming an amorphous cladding around a periphery of the optical fiber based on the amorphous melt and the optical fiber includes:
- forming the amorphous cladding around the periphery of the optical fiber at a constant temperature.

9. The method of claim 1, wherein a viscosity of the amorphous melt is adjusted by adjusting a temperature of the amorphous melt.

10. The method of claim 1, further including:
- lifting the optical fiber with the amorphous cladding formed around the periphery out of the amorphous melt at a predetermined lifting rate, wherein when lifting the optical fiber, perform a post-heating process on the optical fiber with the amorphous cladding formed around the periphery.

11. The method of claim 10, wherein the predetermined lifting rate is in a range of 200 mm/h to 3000 mm/h.

12. The method of claim 1, wherein the performing a crystallization process on the amorphous cladding includes:

depositing a crystallizing agent layer around a periphery of the amorphous cladding; and performing the crystallization process on the amorphous cladding deposited with the crystallizing agent.

13. The method of claim 1, wherein a temperature of the crystallization process is lower than a melting temperature of the amorphous cladding.

14. The method of claim 1, wherein the crystallization process includes an arc discharge process, wherein a shape of an arc discharge in the arc discharge process is adapted to a shape of the optical fiber formed with the amorphous cladding.

15. The method of claim 1, wherein flowing oxygen is introduced during the crystallization process performed on the amorphous cladding.

16. The method of claim 1, wherein a thickness of the amorphous cladding is adjusted by adjusting a temperature of the amorphous melt.

* * * * *